United States Patent

Saito et al.

[11] Patent Number: 5,853,840
[45] Date of Patent: Dec. 29, 1998

[54] DUMMY WAFER

[75] Inventors: Kazuo Saito; Yasushi Mochizuki; Seiji Yamamoto, all of Tokyo, Japan

[73] Assignee: Nisshinbo Industries, Inc., Tokyo, Japan

[21] Appl. No.: 879,192

[22] Filed: Jun. 20, 1997

[30] Foreign Application Priority Data

Jun. 25, 1996 [JP] Japan ................................. 8-185581

[51] Int. Cl.$^6$ ....................................................... B32B 18/00
[52] U.S. Cl. ......................... 428/64.1; 219/649; 118/500; 428/408; 428/698
[58] Field of Search .................................. 428/64.1, 66.6, 428/66.7, 408, 698; 219/649; 118/500

[56] References Cited

U.S. PATENT DOCUMENTS 5,514,439  5/1996  Sibley ..................................... 428/64.1

Primary Examiner—Alexander Thomas
Attorney, Agent, or Firm—Kubovcik & Kubovcik

[57] ABSTRACT

A dummy wafer for use in a process for thin film formation on a wafer, which is made of a silicon carbide obtained by reacting a glassy carbon with silicon or with a silicon-containing gas, or comprises (1) a silicon carbide obtained by reacting a glassy carbon with silicon or with a silicon-containing gas and (2) a silicon carbide layer formed thereon by CVD.

This dummy wafer alleviates the problems of the prior art; shows no warpage and contains no metal to become a contamination source for a semiconductor; has corrosion resistance to hydrofluoric acid, hydrochloric acid, etc., heat resistance and resistance to repeated heat cycles; and is inexpensive.

6 Claims, No Drawings

DUMMY WAFER

BACKGROUND OF THE INVENTION

1. Field of the Invention

The present invention relates to a dummy wafer for use in a process for thin film formation on silicon wafers or on compound semiconductor wafers for the purposes of evaluation of treating conditions, inspection, testing, contamination prevention, contaminant removal by cleaning, transfer monitoring, etc.

2. Description of the Prior Art

In a process for production of large scale integrated circuits (LSI), very large scale integrated circuits (VLSI) or the like, a film is formed on a silicon wafer or on a compound semiconductor wafer by chemical vapor deposition (CVD), physical vapor deposition (e.g. sputtering [PVD]), etching or the like. In this process, for the purposes of evaluation of treating conditions, inspection, testing, contamination prevention, contaminant removal by cleaning, transfer monitoring, etc., there is used, with genuine wafers, a silicon carbide-made dummy wafer to which chemical vapor deposition or physical vapor deposition (e.g. sputtering), etching or the like is applied as is done to genuine wafers.

The silicon carbide-made dummy wafer has been produced mainly by the following methods.

(1) Silicon carbide is deposited on a graphite sheet by CVD; the resulting material is burnt in an oxidizing atmosphere to remove the graphite sheet to obtain a silicon carbide sheet; and the silicon carbide sheet is subjected to machining to obtain a dummy wafer.

(2) A silicon carbide powder is sintered.

(3) Graphite is converted into silicon carbide.

The dummy wafers produced by these methods have had the following problems. In the case of the dummy wafer produced by the method (1), the rate (speed) of deposition of silicon carbide by CVD is low, requiring a long time to obtain a dummy wafer of needed thickness; therefore, the resulting dummy wafer is expensive and, moreover, the silicon carbide deposited on a graphite sheet undergoes strain when the graphite sheet is burnt out, giving a dummy wafer which tends to cause warpage.

In the case of the dummy wafer produced by the method (2), metals which become a contamination source for a semiconductor are easily contained in the dummy wafer and, moreover, the purity of silicon carbide in the dummy wafer is low; therefore, the resulting dummy wafer is not suitable for producing semiconductor devices. In the case of the dummy wafer produced by the method (3), the graphite used as a raw material is available only in the form of a block and, when processed into a sheet, causes warpage; therefore, the dummy wafer obtained therefrom by a reaction for conversion into silicon carbide tends to show warpage.

In addition, the dummy wafers produced by the method (1) or the method (3) are commonly inferior in corrosion resistance to hydrofluoric acid or hydrochloric acid used in a semiconductor production process, heat resistance and resistance to repeated heat cycles, and resultantly have a short life.

OBJECT AND SUMMARY OF THE INVENTION

The object of the present invention is to alleviate the above-mentioned problems of the prior art and provide a dummy wafer which shows no warpage and contains no metal that can become a contamination source for a semiconductor, which has corrosion resistance to hydrofluoric acid, hydrochloric acid, etc., heat resistance and resistance to repeated heat cycles, and which is inexpensive.

According to the present invention, there is provided a dummy wafer for use in a process for thin film formation on a wafer, which is made of a silicon carbide obtained by reacting a glassy carbon with silicon or with a silicon-containing gas, or comprises (1) a silicon carbide obtained by reacting a glassy carbon with silicon or with a silicon-containing gas and (2) a silicon carbide layer formed thereon by CVD.

DETAILED DESCRIPTION OF THE INVENTION

The present invention is hereinafter described in detail.

In the present invention, a glassy carbon is used as a raw material for a dummy wafer. The glassy carbon can be obtained by using, as the raw material, a phenolic resin, a polycarbodiimide resin, a furan resin, a furfural resin, a polyimide resin, other thermosetting resin, a cellulose, or a mixture thereof.

The glassy carbon can be produced by a known general process. For example, the above-mentioned resin or resin mixture is molded into a sheet, and the sheet is fired in an inert atmosphere at a temperature of 900°–3,500° C., preferably 1,000–3,000° C. to obtain a glassy carbon.

The glassy carbon usable in the present invention includes one produced as above and has no particular restriction. However, it preferably has a density of 0.4–1.9 g/cm$^3$, preferably 1.3–1.8 g/cm$^3$, a bending strength of 200 kg/cm$^2$ or more, an impurity content of 500 ppm or less, preferably 100 ppm or less, and a porosity of 0–60%, preferably 0–5%.

When the density is lower than the above range, the resulting dummy wafer is difficult to handle. When the density is higher than the above range, it is difficult for the reaction for converting the glassy carbon into silicon carbide to proceed uniformly. When the bending strength is lower than the above range, the resulting dummy wafer is difficult to handle. The impurity content is preferred to be as low as possible in view of a yield of the semiconductor devices produced from the wafer, since the yield is influenced by the impurity content.

The glassy carbon can be subjected, before use, to a treatment with a halogen type gas in order to increase its purity, or to a high-temperature high-pressure treatment (HIP treatment).

The dummy wafer of the present invention is made of a silicon carbide derived from the above glassy carbon. Since processing for the silicon carbide is difficult, the raw material resin of the glassy carbon or the glassy carbon made therefrom is molded into a wafer shape.

The molding of the resin or the glassy carbon into a wafer shape can be conducted by a general method. The molding of the resin into a wafer shape can be conducted by compression molding, injection molding, transfer molding, casting or the like; and the molding of the glassy carbon into a wafer shape can be conducted by, for example, cutting and grinding using a diamond tool.

The resin or glassy carbon molded into a wafer shape (the latter is preferred) is then reacted with silicon to obtain silicon carbide as a dummy wafer of the present invention. The reaction can be conducted by an ordinary method and has no particular restriction.

When the reaction is conducted against metal silicon, the molded glassy carbon is contacted with metal silicon by one of various methods and then heating is conducted to cause a reaction. The contact can be conducted, for example, by laminating the molded glassy carbon with metal silicon, or by covering the molded glassy carbon with a metal silicon powder or a molded metal silicon, or by covering the molded glassy carbon with metal silicon by vapor deposition, sputtering or the like.

Alternatively, the reaction can be conducted by placing the molded glassy carbon in molten metal silicon, once cooling them, and then heating them. The heating temperature is about 1,000°–2,300° C., preferably about 1,200°–2,100° C.

When the reaction is conducted in a gas phase, the molded glassy carbon is contacted with a silicon-containing gas in a firing furnace and heated. The silicon-containing gas includes, for example, SiO, Si vapor, $SiCl_4$, $SiH_4$ and $SiHCl_3$. The heating temperature is about 1,000°–2,300° C., preferably about 1,200°–2,100° C.

The dummy wafer of the present invention may take another form, i.e., a dummy wafer (2) obtained by forming a silicon carbide layer on the dummy wafer (1) obtained as above, by CVD. The CVD can be ordinary CVD, and no special CVD is required. The dummy wafer (2) can be obtained, for example, by placing the dummy wafer (1) in a reaction chamber, introducing a mixed gas consisting of a halogenated organosilicon compound and hydrogen, into the chamber, and subjecting the halogenated organosilicon compound to reductive thermal decomposition to deposit the resulting silicon carbide on the dummy wafer (1) in a gas phase.

As the halogenated organosilicon compound which is a silicon carbide source, there can be mentioned, for example, $CH_3SiCl_3$, $C_6H_5SiCl_3$, $(CH_3)_2SiCl_2$, $CH_3SiCl_3$, $(CH_3)_3SiCl$, $SiH_2Cl_2$, $SiH_4/CH_4$ and $SiCl_4/CH_4$. The reaction temperature can be about 900°–1,800° C., preferably about 1,000°–1,700° C.

The dummy wafer of the present invention obtained as above can be subjected to a surface treatment ordinarily used, in order to improve the surface condition. The surface treatment includes, for example, lapping and polishing using free abrasive grains or fixed abrasive grains, and cutting and grinding using a diamond tool.

Thus, the dummy wafer of the present invention is obtained by subjecting a glassy carbon of sheet shape or dummy wafer shape having neither warpage nor strain, to a reaction for conversion into silicon carbide. Therefore, the present dummy wafer is free from warpage or strain and contains no metal which becomes a contamination source for a semiconductor. In addition, being produced from a glassy carbon, the resulting dummy wafer has a uniform structure of silicon carbide, and is superior in corrosion resistance, heat resistance and resistance to repeated heat cycles.

Since the present dummy wafer can be produced simply by subjecting a glassy carbon of sheet form or dummy wafer shape to a reaction for conversion into silicon carbide, the present dummy wafer can be obtained in a short production time and, as compared with when using a conventional CVD method, at a low cost.

When a silicon carbide layer is formed on the dummy wafer (1) by CVD, there can be obtained a dummy wafer (2) which is covered with CVD silicon carbide of higher purity. In this dummy wafer (2), the dummy wafer (1) and the silicon carbide layer have high adhesivity to each other since the silicon carbide layer is made of substantially the same material as that of the dummy wafer (1).

The present invention is described in more detail below by way of Examples.

EXAMPLE 1

A glassy carbon sheet derived from a polycarbodiimide resin, having an impurity content of 2 ppm, a density of 1.55 $g/cm^3$, a bending strength of 2,300 $kg/cm^2$, a porosity of 0%, a diameter of 8 in. and a thickness of 0.725 mm, was placed in a metal silicon powder having an average particle diameter of 5 $\mu$m and a purity of 99.999%. They were subjected to a heat treatment at 1,400° C. in vacuum in a firing furnace to convert the glassy carbon sheet into silicon carbide (a solid phase reaction), whereby a dummy wafer was obtained.

In anticipation of utilizing the dummy wafer in the production of a semiconductor, the dummy wafer was immersed in a $HF/HNO_3$ mixed acid to examine its weight change. Separately, the dummy wafer was heated at 1,000° C. for 100 hours in air to examine its weight change. Also separately, the dummy wafer was subjected repeatedly to a heat cycle consisting of temperature elevation from room temperature to 700° C. in 30 minutes, maintaining 700° C. for 1 hour, and cooling to room temperature, to examine the times of heat cycles at which cracking first appeared. The results obtained are shown in Table 1.

EXAMPLE 2

Using a glassy carbon sheet derived from a phenolic resin and subjected to a high-temperature high-pressure (HIP) treatment, having an impurity content of 2 ppm, a density of 1.81 $g/cm^3$, a bending strength of 2,000 $kg/cm^2$, a porosity of 0%, a diameter of 8 in. and a thickness of 0.725 mm, a dummy wafer was obtained in the same manner as in Example 1. The dummy wafer was subjected to the same tests (immersion-in-mixed-acid test, heating test and repeated heat cycle test) as in Example 1. The results obtained are shown in Table 1.

EXAMPLE 3

Using a glassy carbon sheet derived from a furan resin, having an impurity content of 50 ppm, a density of 1.49 $g/cm^3$, a bending strength of 1,500 $kg/cm^2$, a porosity of 3%, a diameter of 8 in. and a thickness of 0.725 mm, a dummy wafer was obtained in the same manner as in Example 1. The dummy wafer was subjected to the same tests (immersion-in-mixed-acid test, heating test and repeated heat cycle test) as in Example 1. The results obtained are shown in Table 1.

Comparative Example 1

(silicon carbide wafer converted from graphite)

Using a graphite sheet produced from an isotropic graphite (density: 1.85 $g/cm^3$) and having a diameter of 8 in. and a thickness of 0.725 mm, a dummy wafer was obtained in the same manner as in Example 1. The dummy wafer was subjected to the same tests (immersion-in-mixed-acid test, heating test and repeated heat cycle test) as in Example 1. The results obtained are shown in Table 1.

Comparative Example 2

(CVD silicon carbide wafer)

The same graphite sheet as used in Comparative Example 1 was placed in a CVD reactor; a mixed gas consisting of $CH_3SiCl_3$ and hydrogen was introduced into the reactor; and a silicon carbide layer was formed on the graphite sheet by CVD at 1,300° C. The resulting material was oxidized in air of 1,000° C. to remove the graphite portion to obtain a silicon carbide sheet. The silicon carbide sheet was made into a silicon carbide wafer having a diameter of 8 in. and a thickness of 0.725 mm. The wafer was subjected to the same tests (immersion-in-mixed-acid test, heating test and repeated heat cycle test) as in Example 1. The results obtained are shown in Table 1.

Examples 7–9 and Comparative Example 4

The glassy carbon sheets used in Examples 4–6 and the graphite sheet used in Comparative Example 3 were placed in a CVD reactor. A mixed gas consisting of hydrogen and $CH_3SiCl_3$ was introduced into the reactor, and a silicon carbide layer having a thickness of 120 $\mu$m was formed on each sheet at 1,300° C. by CVD.

The thus-obtained silicon carbide-covered dummy wafers were subjected to the same tests as in Example 1. The results

TABLE 1

| | Raw Material | Condition of silicon carbide | Immersion-in-mixed-acid test | Heating test | Repeated heat cycle test |
|---|---|---|---|---|---|
| Example 1 | Glassy carbon | Completely converted into silicon carbide of good condition with no warpage. | No weight change | No weight change | No cracking after 200 heat cycles |
| Example 2 | Glassy carbon | Completely converted into silicon carbide of good condition with no warpage. | No weight change | No weight change | No cracking after 200 heat cycles |
| Example 3 | Glassy carbon | Completely converted into silicon carbide of good condition with no warpage. | No weight change | No weight change | No cracking after 200 heat cycles |
| Comparative Example 1 | Graphite | The surface (about 200 $\mu$m) was converted into silicon carbide, but carbon remained inside. Large warpage | Weight decrease by 10 parts by weight. | Weight decrease by 30 parts by weight. | Cracking appeared in 30 heat cycles. |
| Comparative Example 2 | CVD Silicon carbide | Silicon carbide caused warpage after being peeled from graphite. | Weight decrease by 2 parts by weight. | No weight change | Warpage increased in 3 heat cycles. Cracking appeared in 25 heat cycles. |

Examples 4–6 and Comparative Example 3

The glassy carbon sheets used in Examples 1–3 and the graphite sheet used in Comparative Example 1 were placed in a firing furnace and subjected to a heat treatment at 2,000° C. while a mixed gas consisting of argon and $SiHCl_3$ was being passed through the furnace, whereby the sheets were converted into respective silicon carbide sheets (a gas-phase reaction).

The thus-obtained dummy wafers were subjected to the same tests as in Example 1. The results obtained are shown in Table 2.

obtained are shown in Table 3.

TABLE 2

| | Raw Material | Condition of silicon carbide | Immersion-in-mixed-acid test | Heating test | Repeated heat cycle test |
|---|---|---|---|---|---|
| Example 4 | Glassy carbon | Completely converted into silicon carbide of good condition with no warpage. | No weight change | No weight change | No cracking after 200 heat cycles |
| Example 5 | Glassy carbon | Completely converted into silicon carbide of good condition with no warpage. | No weight change | No weight change | No cracking after 200 heat cycles |
| Example 6 | Glassy carbon | Completely converted into silicon carbide of good condition with no warpage. | No weight change | No weight change | No cracking after 200 heat cycles |
| Comparative Example 3 | Graphite | The surface (about 200 $\mu$m) was converted into silicon carbide, but carbon remained inside. Large warpage. | Weight decrease by 9 parts by weight. | Weight decrease by 30 parts by weight. | Cracking appeared in 18 heat cycles. |

TABLE 3

| | Raw Material | Condition of silicon carbide | Immersion-in-mixed-acid test | Heating test | Repeated heat cycle test |
|---|---|---|---|---|---|
| Example 7 | Example 4 | Good condition with no warpage | No weight change | No weight change | Neither peeling nor cracking in 200 heat cycles |
| Example 8 | Example 5 | Good condition with no warpage | No weight change | No weight change | Neither peeling nor cracking in 200 heat cycles |
| Example 9 | Example 6 | Good condition with no warpage | No weight change | No weight change | Neither peeling nor cracking in 200 heat cycles |
| Comparative Example 4 | Comparative Example 3 | Warpage appeared. | No weight change | Weight decrease by 2 parts by weight. | Warpage increased in 2 heat cycles. Cracking appeared in 3 heat cycles. |

As is appreciated from the above results, the dummy wafer of the present invention has no warpage and is high in acid resistance, good in heat resistance and superior in resistance to repeated heat cycles.

What is claimed is:

1. A dummy wafer for use in a process for thin film formation on a wafer, said dummy wafer being made of a silicon carbide obtained by reacting a glassy carbon with silicon or with a silicon-containing gas.

2. A dummy wafer for use in a process for thin film formation on a wafer, said dummy wafer comprising (1) a silicon carbide obtained by reacting a glassy carbon with silicon or with a silicon-containg gas and (2) a silicon carbide layer formed on said silicon carbide by CVD.

3. A dummy wafer as claimed in claim 1, wherein said silicon carbide is obtained using a glassy carbon having a density of 0.4–1.9 g/cm$^3$.

4. A dummy wafer as claimed in claim 1, wherein said silicon carbide is obtained using a glassy carbon having a density of 1.3–1.8 g/cm$^3$.

5. A dummy wafer as claimed in claim 2, wherein said silicon carbide is obtained using a glassy carbon having a density of 0.4–1.9 g/cm$^3$.

6. A dummy wafer as claimed in claim 2, wherein said silicon carbide is obtained using a glassy carbon having a density of 1.3–1.8 g/cm$^3$.

* * * * *